United States Patent
Duthaler et al.

(10) Patent No.: US 6,521,489 B2
(45) Date of Patent: Feb. 18, 2003

(54) PREFERRED METHODS FOR PRODUCING ELECTRICAL CIRCUIT ELEMENTS USED TO CONTROL AN ELECTRONIC DISPLAY

(75) Inventors: Gregg Duthaler, Needham, MA (US); Karl R. Amundson, Cambridge, MA (US); Paul Drzaic, Morgan Hill, CA (US); Peter Kazlas, Sudbury, MA (US); Jianna Wang, Waltham, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 10/128,014

(22) Filed: Apr. 23, 2002

(65) Prior Publication Data

US 2002/0119584 A1 Aug. 29, 2002

Related U.S. Application Data

(62) Division of application No. 09/621,049, filed on Jul. 21, 2000, now Pat. No. 6,413,790.
(60) Provisional application No. 60/144,952, filed on Jul. 21, 1999.

(51) Int. Cl.[7] .............................................. H01L 21/00
(52) U.S. Cl. ..................................................... 438/149
(58) Field of Search ........................... 438/21, 153, 154, 438/142, 149

(56) References Cited

U.S. PATENT DOCUMENTS

| | | | | |
|---|---|---|---|---|
| 5,710,070 A | * | 1/1998 | Chan ........................... | 438/21 |
| 6,355,942 B1 | * | 3/2002 | Yamazaki et al. ............. | 257/72 |
| 6,384,727 B1 | * | 5/2002 | Diprizio et al. ............. | 340/572 |

FOREIGN PATENT DOCUMENTS

| | | | |
|---|---|---|---|
| EP | 0 930 641 A2 | 7/1999 | ........... H01L/21/00 |
| JP | 59162057 | 9/1984 | ............... B41J/3/04 |
| JP | 04060518 | 2/1992 | ........... G02F/1/339 |
| WO | WO 99/39373 | 8/1999 | ......... H01L/21/314 |

OTHER PUBLICATIONS

XP–000783907 "All–Polymer Field–Effect Transistor Realized by Printing Techniques," Francis Garnier, Ryad Hajlaoui, Abderrahim Yassar, Pratima Srivastava, SCIENCE, vol. 265, Sep. 16, 1994, pp. 1684–1686.
XP–000737411 "Ink–jet printing of doped polymers for organic light emitting devices," T.R. Hebner, C.C. Wu, D. Marcy, M. H. Lu, and J. C. Sturm, Appl. Phys. Lett., vol. 72, No. 5, Feb. 2, 1998, pp. 519–521.
XP–000876551 "Integrated Optoelectronic Devices Based on Conjugated Polymers," Henning Sirringhaus, Nir Tessler, Richard H. Friend, www.sciencemag.org, SCIENCE, vol. 280, Jun. 12, 1998 pp. 1741–1744.
XP–000771188 "Organic smart pixels," A. Dodabalapur, Z. Bao, A. Makhija, J. G. Laquindanum, V. R. Raju, Y. Feng, H. E. Katz, and J. Rogers, Applied Physics Letters, vol. 73, No. 2, Jul. 13, 1998, pp. 142–144.
32.2: "The Development of Super–High Aperture Ratio with Low Electrically Resistive Material for High–Resolution TFT–LCDs," S. Nakabu, K. Yano, M. Katayama, T. Hirobe, T. Tarui, Y. Hibino, Sharp Corp., Mie, Japan, T. Voutsas, Sharp Microelectronics Technology, Camas, WA, 732 SID 99 DIGEST, pp. 732–735.

* cited by examiner

*Primary Examiner*—David Nelms
*Assistant Examiner*—Thao P Le
(74) *Attorney, Agent, or Firm*—Testa, Hurwitz & Thibeault, LLP (57) ABSTRACT

Systems and methods for producing thin film transistor structures useful in controlling electronic displays. Thin film transistors are fabricated using all-additive methods including printing techniques, soft lithography and material deposition methods. The thin film transistors can be deposited with the gate on the bottom or on the top of the structure. The deposition methods include the possibility of isolating nearly completely the transistor structure from the electronic display devices, so as to minimize or eliminate deleterious interactions therebetween.

16 Claims, 4 Drawing Sheets

PREFERRED METHODS FOR PRODUCING ELECTRICAL CIRCUIT ELEMENTS USED TO CONTROL AN ELECTRONIC DISPLAY

CROSS-REFERENCE TO RELATED APPLICATIONS

This application claims priority to and is a divisional of U.S. Ser. No. 09/621,049, filed Jul. 21, 2000 now U.S. Pat. No. 6,413,790, which claims the benefit of U.S. provisional patent application Ser. No. 60/144,952, filed Jul. 21, 1999. Both of these applications are incorporated herein in their entireties by reference.

FIELD OF THE INVENTION

This invention relates generally to systems and methods for producing electrical circuit elements for control. More particularly, the invention relates to the use of printing technology to manufacture electrical circuit control elements.

BACKGROUND OF THE INVENTION

Most conventional electronic displays are driven by electrical circuit elements that are produced using a multistep process that makes extensive use of photolithographic patterning techniques. Photolithographic processes are technically well-suited for modern displays, offering high resolution capability and excellent device performance. Unfortunately, the capital equipment and related infrastructure associated with these processes is extremely expensive. It is therefore highly desirable to find lower-cost alternatives to conventional microfabrication processes.

Specifically, it is desirable to develop alternative processes that are all-additive; that is, functional materials are directly deposited in an arrangement that leads to the formation of functional electrical circuit elements. Moreover, such processes promise reduced material and consumable costs, dramatically simplified process flows, and higher throughput manufacturing.

SUMMARY OF THE INVENTION

In one aspect the invention relates to a method of manufacturing an addressing device for an electronic display. The method includes providing a substrate and fabricating the addressing device adjacent a surface of the substrate by treating the surface to control one of a contact angle of a liquid with the surface, a surface roughness and a surface energy, and printing at least one circuit element of the addressing device.

In one embodiment, the contact angle is controlled to be less than 90 degrees. In a preferred embodiment, the contact angle is controlled to be less than 60 degrees.

In another aspect, the invention relates to a method of manufacturing an addressing device for an electronic display. The method includes providing a substrate, and fabricating the addressing device adjacent a surface of the substrate by printing at least one circuit element by (i) screen printing a gate structure, (ii) ink jet printing a dielectric material and a semiconductor, (iii) screen printing coarse features of a source structure and a drain structure, and (iv) printing by use of soft lithography the high resolution features of the source structure and the drain structure. In one embodiment, screen printing involves using a conductive paste. The conductive paste has a viscosity between about 1000 cP and about 50000 cP.

In another embodiment, the method includes printing an encapsulant for protecting a portion of the addressing device. In still another embodiment, the method includes ink jet printing at least one circuit element using an ink having a viscosity of less than about 100 cP. In another embodiment, ink jet printing involves using a plurality of particles that are smaller than ¼ of a diameter of an orifice of an ink jet head. In a preferred embodiment, ink jet printing is performed using a plurality of particles that are smaller than ¹⁄₁₀ of a diameter of an orifice of an ink jet head.

In another embodiment, the method includes ink jet printing at least one circuit element using an ink comprising a semiconductor dissolved in a solvent. In another embodiment, ink jet printing includes ink jet printing using an ink comprising a dielectric material dissolved in a solvent.

In still another embodiment, the method includes ink jet printing at least one circuit element by moving an ink jet head relative to the substrate at a speed U, where U is less than the quantity 2RF, where R is a drop radius and F is a drop ejection frequency.

In a further embodiment, ink jet printing includes freezing an ink jet drop upon the substrate upon impact. In yet another embodiment, an ink jet drop is frozen by independent control of the substrate temperature.

In an additional embodiment, printing by use of soft lithography includes printing at least one circuit element by microcontact printing using one of an elastomeric stamp and a rigid stamp. In still further embodiments, printing by use of soft lithography includes printing through one of a contact mask and a proximity mask, printing at least one circuit element using one of evaporation, sputtering and chemical vapor deposition, and printing at least one circuit element by transferring an ink from a mold to the substrate and curing the ink. In another embodiment, printing by use of soft lithography includes printing at least one circuit element using a mold having the surface property that an ink when dried adheres preferentially to a surface upon which the ink is being printed rather than to the mold.

In yet further embodiments, ink jet printed semiconductor material is selected from the class of materials consisting of polythiophenes, oligothiophenes, polythienylenevinylene, polyphenylenevinylene, and their derivatives, and colloidal suspensions of inorganic semiconductive particles, and ink jet printed insulating material is selected from the class of materials consisting of soluble polymers, glasses, inorganic films, and composite materials.

In still an additional embodiment, an ink jet printing step is replaced by a printing step involving a vacuum based process selected from evaporation, sputtering, reactive gas processing and chemical vapor deposition.

In other embodiments, a screen printing step is replaced by a printing step involving a vacuum based process selected from evaporation, sputtering, reactive gas processing and chemical vapor deposition, a step involving printing using soft lithography is replaced by a printing step involving a vacuum based process selected from evaporation, sputtering, reactive gas processing and chemical vapor deposition, and a plurality of, but not all, steps are replaced by a plurality of printing steps, each of the plurality of printing steps involving a vacuum based process selected from evaporation, sputtering, reactive gas processing and chemical vapor deposition.

In another aspect, the invention relates to a method of manufacturing an electronic device. The method includes (a) providing a substrate, (b) depositing a gate structure on the substrate using flexo-gravure printing, and (c) depositing a layer of dielectric material using slot coating, the layer of dielectric material covering the gate structure and a portion of the substrate. The method also includes (d) depositing adjacent the dielectric layer on a side thereof opposite the gate structure using screen printing a low resolution feature of a source structure and a low resolution feature of a drain structure, the source structure and the drain structure being deposited in a patterned structure having a space therebetween, (e) depositing a semiconductor material adjacent the dielectric layer in the space between the source structure and the drain structure using ink jet printing. and (f) disposing at least one electronic element adjacent the addressing device, such that the addressing device addresses the at least one electronic element to control a behavior of the electronic element In one embodiment the method can additionally include, after step (c) and before step (d), depositing adjacent the dielectric layer on a side thereof opposite the gate structure a high resolution feature of a source structure and a high resolution feature of a drain structure using soft lithography techniques, the source structure and the drain structure having a space therebetween.

In another aspect, the invention relates to a transistor for addressing an electronic display. The transistor includes a substrate, a gate structure disposed adjacent a portion of the substrate, the gate structure formed by flexo-gravure printing, and a dielectric film disposed adjacent the gate and the substrate, the dielectric film formed by slot coating. The transistor also includes a source and a drain disposed adjacent the dielectric film, the source and the drain separated one from the other, the source and the drain formed using at least one of soft lithography and screen printing, and a semiconductor film disposed adjacent a portion of the dielectric film and between the source and the drain , the semiconductor film formed by ink-jet printing. wherein a selected one of the source and the drain is in electrical communication with a pixel electrode.

In one aspect, the invention features a method of manufacturing an addressing device for an electronic display comprising: (a) providing a substrate; and (b) fabricating the addressing device adjacent a surface of the substrate using one or more all-additive fabrication processes. In preferred embodiments, step b) comprises fabricating the addressing device by "printing" at least one circuit element of the addressing device. The printing can be performed using any appropriate printing step including: screen printing; stencil printing; ink-jet printing; soft lithography; offset, flexographic, intaglio, or gravure printing; or similar methods known to those skilled in the field. In another embodiment, step b) comprises using at least two different additive steps.

In another embodiment, step b) comprises printing a conductive line, a resistor, an electrode, an encapsulant for at least one circuit element, a diode or portion thereof, a varistor or portion thereof, or a field effect transistor or portion thereof. In preferred embodiments, printed elements are combined together to form a passive matrix array, a control grid structure, a diode array, a varistor array, a field effect transistor based active matrix array, logic circuits, or other complex circuits.

In one embodiment, step b) comprises printing at least one circuit element using a conducting paste (e.g. graphite, silver, gold, or nickel particles dispersed in a polymeric material). In a detailed embodiment, step b) comprises printing at least one circuit element using a conductive paste having a viscosity of between about 1000 cP and about 50000 cP.

In one embodiment, step b) comprises printing at least one circuit element by: b1) dissolving an ink material in a solvent; b2) printing the ink material on the substrate; and b3) removing the solvent. In another detailed embodiment, step b) comprises printing at least one circuit element by b1) printing a photocurable ink material on the substrate; and b2) curing the ink material by photoexposure.

In another embodiment, step b) comprises printing a conductive polymer or a colloidal dispersion of conductive particles. In a detailed embodiment, step b) comprises the use of ink jet, offset, flexographic, intaglio, or gravure printing of at least one circuit element using a conductive material with a viscosity of less than about 1000 cP.

In one embodiment, step b) comprises ink jet printing at least one circuit element using a dielectric dissolved in a solvent. Alternatively, step b) can comprise ink jet printing at least one circuit element using a semiconducting material dissolved in a solvent.

In one detailed embodiment, step b) comprises ink jet printing at least one circuit element using a plurality of particles that are so small that they do not substantially clog the orifice of an ink jet print head. This is best accomplished when the particles are smaller than about ¼ of the diameter of the orifice, but to achieve high yield it is preferable that the particles are smaller than ¹⁄₁₀ of a diameter of the orifice.

In one embodiment, step b) comprises ink jet printing at least one circuit element by moving an ink jet head relative to the substrate at a speed such that the drops print a continuous line (i.e. traverse speed U<2RF, where R is a drop radius and F is a drop ejection frequency). In another embodiment, step b) comprises ink jet printing at least one circuit element by solidifying an ink-jetted drop on the substrate upon impact with the substrate.

In another embodiment, step b) comprises printing at least one circuit element by printing a functional material using an elastomeric or rigid stamp or printing plate. In a detailed embodiment, step b) comprises printing at least one circuit element by transferring an ink from a mold to the substrate and thereafter curing the ink. In another detailed embodiment, step b) comprises printing at least one circuit element by transferring an ink from a mold to the substrate after the ink has been substantially cured while in contact with the mold.

To produce continuous (i.e. unbroken) fine lines in embodiments involving wet printing, particularly in those embodiments which make use of materials with viscosities less than a few thousand cP, it is preferable to treat the substrate surface to adjust the equilibrium contact angle of the liquid on the surface. This may be done by applying a chemical treatment (e.g. hexamethyldisilazane, octadecyltrichlorosilane, or similar materials), by exposing the surface to a plasma treatment, or using other methods known to those skilled in the field. It is preferable for these embodiments that the surface energy of the substrate be adjusted such that the equilibrium contact angle of the liquid on the surface is substantially less than 90 degrees, preferably less than 60 degrees. This helps to ensure that long, slender beads of liquid do not break up into discrete drops due to capillary instability or disjoining pressure.

In another embodiment, step b) comprises forming at least one circuit element through vacuum-based deposition including but not limited to: evaporation, sputtering or chemical vapor deposition.

The circuit element can be printed using colloidal conductive particles, carbon, graphite, silver, nickel, palladium, or metal oxides. The circuit elements can be printed using polyaniline, polyethyldioxithiophene, or other conductive polymers. The circuit elements can be deposited using an inorganic semiconductor such as silicon, cadmium selenide, or gallium arsenide. The circuit elements can be printed using organic semiconductors, such as poly(3-alkyl) thiophene, hexathiophene and other oligothiophenes, αω-dihexyl quaterthiophene and other alkylsubstituted oligithiophenes, and other soluble organic semiconductors. The circuit elements can also be printed using a dielectric material such as benzocyclobutene (Dow Chemical), polyimids, polyvinylphenol, or spin-on-glass materials.

In the preferred embodiment, step b) comprises printing at least one circuit element by using: b1) screen, offset, flexographic, intaglio, gravure, or ink jet printing to define the gate structure; b2) slot, dip, knife-over-roll, or spin coating, offset, flexographic, intaglio, gravure, or ink jet printing, or vacuum deposition techniques to deposit dielectric material; b3) slot, dip, knife-over-roll, or spin coating, offset, flexographic, intaglio, gravure, or ink jet printing, or vacuum deposition techniques to deposit semiconducting material; b4) screen, offset, flexographic, gravure, or ink jet printing to define the source and drain structure. For some designs, it is essential that the source and drain structure comprise high resolution features, which may be formed using soft lithography techniques or photolithographic patterning (i.e. subtractive) techniques.

In another aspect, the invention features a method of making an electronic display comprising the steps of: (a) providing a substrate; (b) providing an electronic display media adjacent the substrate; and (c) fabricating the addressing device adjacent a surface of the substrate using an additive fabrication process. In one embodiment, the electronic display media comprises an encapsulated electronic display media. In one detailed embodiment, the encapsulated electronic display media includes electrophoretic particles dispersed in a fluid.

In still another aspect, the invention features a method of making an electronic device comprising: (a) fabricating a first portion of the device using a first additive fabrication process; and (b) fabricating a second portion of the device using a second additive fabrication process different from the first additive fabrication process.

In still another aspect, the invention features a transistor for addressing an electronic display. In one embodiment, the transistor comprises: a substrate; a gate disposed adjacent a portion of the substrate; a dielectric film disposed adjacent the gate and the substrate; a semiconductor film disposed adjacent a portion of the dielectric film; a drain disposed adjacent the semiconductor film; and a source disposed adjacent the semiconductor film, wherein the source is in electrical communication with a pixel electrode.

In another embodiment, the transistor comprises: a substrate; a source and a drain disposed adjacent a portion of the substrate; a semiconductor film disposed adjacent the source, the substrate and the drain; a dielectric film disposed adjacent the semiconductor film; and a gate disposed adjacent a portion of the semiconductor film, wherein the source is in electrical communication with a pixel electrode.

In another embodiment, the transistor comprises: a substrate; a gate disposed adjacent a portion of the substrate; a dielectric film disposed adjacent the gate and the substrate; a semiconductor film disposed adjacent a portion of the dielectric film; a source and a drain disposed adjacent a portion of the semiconductor film; an insulator film disposed adjacent the drain, the semiconductor film and a portion of the source; and a pixel electrode disposed adjacent the insulator film and the source, wherein the insulator film isolates the source from the drain and the pixel electrode from the drain.

In still another embodiment, the transistor comprises: a substrate; a source and a drain disposed adjacent the substrate; a semiconductor film disposed adjacent the source, the drain and the substrate; a dielectric film disposed adjacent the semiconductor film; a gate disposed adjacent the dielectric film; an insulator film disposed adjacent the gate and the dielectric film; and a pixel electrode disposed adjacent the insulator film, wherein the pixel electrode is in electrical communication with the source through the insulator film and the semiconductor film.

In still another embodiment, the transistor comprises: a substrate; a gate disposed adjacent the substrate; a dielectric film disposed adjacent the substrate and the gate; a semiconductor film disposed adjacent the dielectric film; a drain and a source disposed adjacent the semiconductor film; an insulator film disposed adjacent the semiconductor film; and a pixel electrode disposed adjacent the source and the insulator film, wherein the insulator film isolates the pixel electrode from the semiconductor film.

In yet another embodiment, the transistor comprises: a substrate; a gate disposed adjacent the substrate; a dielectric film disposed adjacent the gate and the substrate; a semiconductor film disposed adjacent the dielectric film; a drain and source disposed adjacent the semiconductor film; an insulator film disposed adjacent the drain, the semiconductor film and the source; and a pixel electrode disposed adjacent the insulator film, wherein the pixel electrode is isolated from the drain through the insulator film and the pixel electrode is in electrical communication with the source.

In yet another embodiment, the transistor comprises: a substrate; a gate disposed adjacent the substrate; a dielectric layer disposed adjacent the gate and the substrate; a drain and a source disposed adjacent the dielectric layer; and a semiconductor film disposed adjacent the drain, the dielectric layer and the source.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

The present inventions describe methods by which one or more all-additive printing steps (e.g. screen and stencil, ink jet, offset, flexographic, intaglio, or gravure printing) may be used to produce the electrical elements and electrical element arrays needed to drive electronic displays. These electronic displays include, but are not limited to electrophoretic, liquid crystal, rotating ball, or rotating needle displays. Since the disclosed manufacturing methods are not based upon traditional photolithography techniques, but are instead more appropriately defined as "printing" processes, they hold the promise of dramatically altering the cost structure of electronic display manufacturing.

The invention discloses the use of inexpensive additive (i.e., printing) processes to replace expensive subtractive (i.e., resists plus etching) processing methods to form patterned electronic devices. Typically, patterned electronic components are made through the creation of a resist pattern (defined using photolithography) on a substrate. In this process, either positive resists or negative resists can be used to form patterned polymer layers, which protect the underlying substrate against etchants. After the patterned resist is formed an etching step is used to pattern the substrate, followed by removal of the resist pattern. This process typically requires at least seven steps: resist deposition, resist drying, resist exposure, resist development, resist curing, etching (or deposition) of active material, and resist removal. Additive processes, in which the active material is deposited in a single printing step followed by a cure step, offer significant cost advantages. While most of the additive processes involve solvent-based printing, it is also possible to use other processes (such as evaporation through a proximity or contact mask) to achieve a patterned material useful in an electronic device.

Also, we describe a preferred architecture in which a field effect transistor is buried underneath an encapsulation layer and a pixel electrode, each deposited using all-additive printing techniques.

There exist several types of electronic addressing architectures commonly employed on modern electronic displays, including but not limited to passive matrix, diode array, and transistor array. Currently, the high-resolution features (features sizes less than about 20 μm are needed for high performance displays with resolution greater than about 70 dpi) of these systems are produced using photolithographic processes. Using the inventions described herein, low and moderate resolution (some feature sizes as large as 250 μm may be incorporated into displays with resolution ranging from about 10 to 70 dpi) device architectures are enabled. With suitable advances in manufacturing process control, these same technologies will yield high-resolution features, thereby enabling low-cost, high performance electronic display manufacture.

The all-additive printing technologies at the core of this invention are: 1) screen and stencil printing, 2) ink jet printing, 3) offset, flexographic, intaglio, or gravure printing, and 4) soft lithography techniques. These methods may be used alone or in a hybrid manner, to draw upon the strengths of different techniques to build the desired device. In the interest of brevity, this disclosure discusses these printing technologies in the context of the production of active matrix transistor arrays to drive electronic displays. The methods outlined can easily be applied to produce diode arrays, passive matrix arrays, control grids, and other complex circuitry used in the electronic display field.

Buried Transistor Designs

In a preferred embodiment of the present invention, additive printing processes are used to encapsulate, or bury, select portions of a thin film transistor.

A bottom-gate transistor is built by depositing a patterned gate structure, a dielectric film, a semiconductor film, optionally an electrical contact film (for amorphous silicon semiconductors, this film may comprise n+doped silicon; for organic semiconductors this film is not needed), and patterned source and drain structures. There are three primary disadvantages of the use of a bottom gate active matrix architecture to drive electronic displays: 1) after display assembly, the exposed drain lines are placed in intimate contact with the display medium, so data signals sent to the display may change the optical state of the display above the drain lines; 2) the aperture of the display (the ratio of the area of the pixel electrode area to the area of the pixel cell size on the display) is limited by the size of the data lines; and 3) the semiconductor material may be contaminated due to direct exposure to the display medium.

Disadvantage 1 affects the design of commercial displays. In liquid crystal displays, for example, the data line signals spuriously switch the display material. The spuriously switched material, however, is obscured from the viewer's eye by a "black mask" built into a precision color filter (built using photolithographic techniques) that is aligned and attached to the front of the display.

At least some of the aforementioned disadvantages can be overcome inexpensively, with adequate resolution and with high throughput by forming buried transistors using additive printing processes in accordance with the present invention, whereas overcoming these disadvantages using conventional photolithographic techniques involves much greater complexity and expense. Preferred embodiments of the present invention described below, allow the function of the "black mask" to be incorporated directly into the array electronics. In contrast, color filters with integral black masks produced by photolithographic techniques are one of the most expensive components in commercial displays.

Figure 2A:
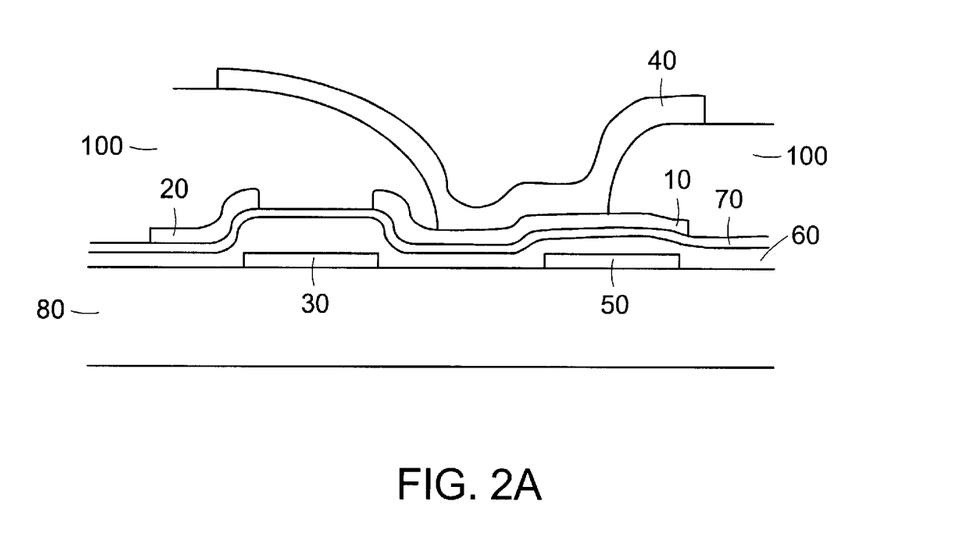
FIG. 2A shows an exemplary embodiment of the invention having a buried transistor architecture comprising a bottom gate thin film transistor (TFT).
Figure 2B:
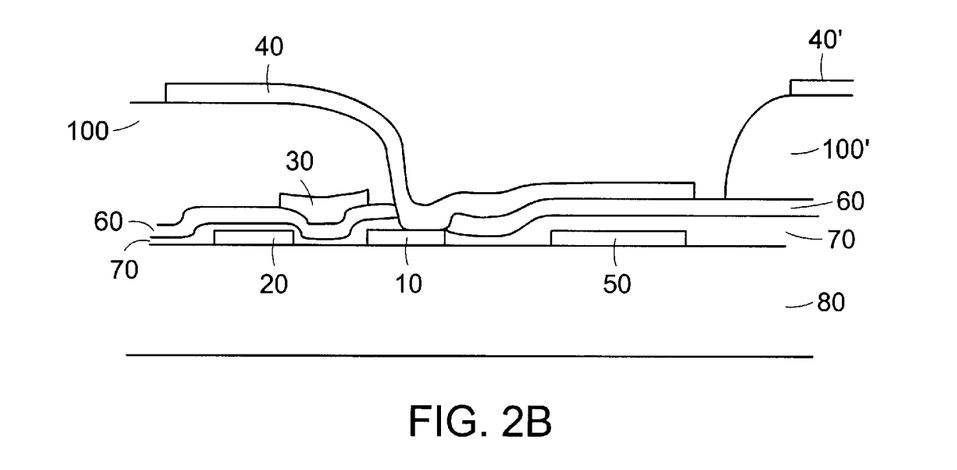
FIG. 2B shows another exemplary embodiment of the invention having a buried transistor architecture comprising a top gate thin film transistor.
Figure 2C:
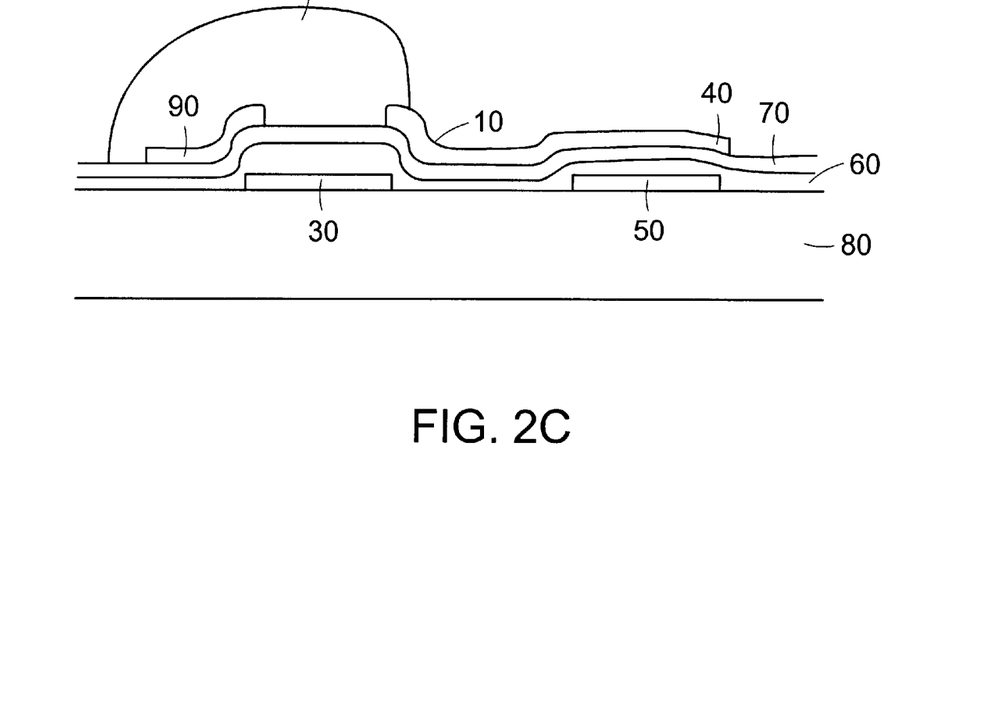
FIG. 2C shows still another exemplary embodiment of the invention having a buried transistor architecture comprising a bottom gate thin film transistor.

In one form of a buried transistor, illustrated in FIG. 2C, a film of insulating material 100 is printed over the exposed data lines 90 of a bottom gate TFT, thereby shielding the display medium adjacent the TFT from the electrical signals passing along these data lines. This structure remedies Disadvantages 1 and 2 above. In each of the FIGs. a substrate 80 is provided upon which the device is fabricated. Various devices comprise a semiconductor layer 70 and can comprise an insulator or dielectric layer 60.

In another form of a buried transistor, illustrated in FIG. 2A, a film of insulating material 100 is printed over a bottom gate TFT leaving small apertures over whichever of the source 10 and drain 20 electrodes is to be connected to a pixel electrode 40. Subsequently, a conductive material is patterned on top of the film of insulating material such that the conductive material forms pixel electrodes 40 which make electrical contact, via the apertures, with the source or drain electrodes of the TFTs. This structure remedies all three of the aforementioned Disadvantages by fully encapsulating the semiconductor and the data lines and by decoupling the aperture of the display from the size of the data lines.

Figure 2D:
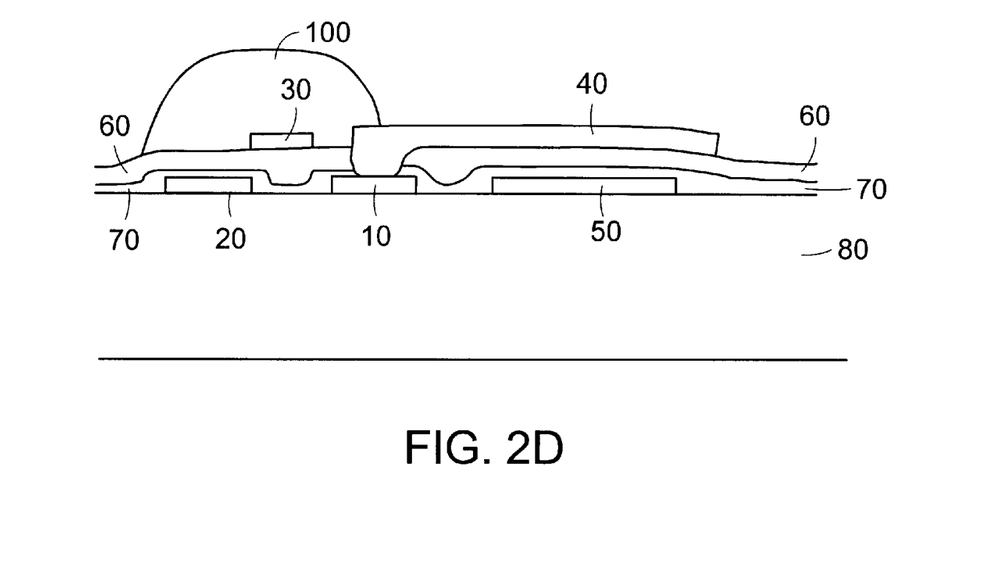
FIG. 2D shows another exemplary embodiment of the invention having a buried transistor architecture comprising a top gate thin film transistor.

Similar buried transistor architectures can be used with top gate TFTs, which are constructed by depositing the source and drain structures, depositing the semiconductor layer (and optionally an electrical contact film, as described above for bottom gate TFTs), depositing a dielectric layer and depositing a gate structure. As shown in FIG. 2D, such a top gate TFT may be buried using the present invention by depositing an insulating material 100 above the exposed gate 30 lines, thereby electrically shielding the display medium from these lines.

Alternatively, as shown in FIG. 2B, an insulating film 100 may be patterned over the TFTs leaving small apertures over whichever of the source 10 and drain 20 electrodes is to be connected to a pixel electrode 40. Subsequently, a conductive material is patterned on top of the film of insulating material such that the conductive material forms pixel electrodes 40 which make electrical contact, via the apertures, with the source or drain electrodes of the TFT.

Figure 1A:
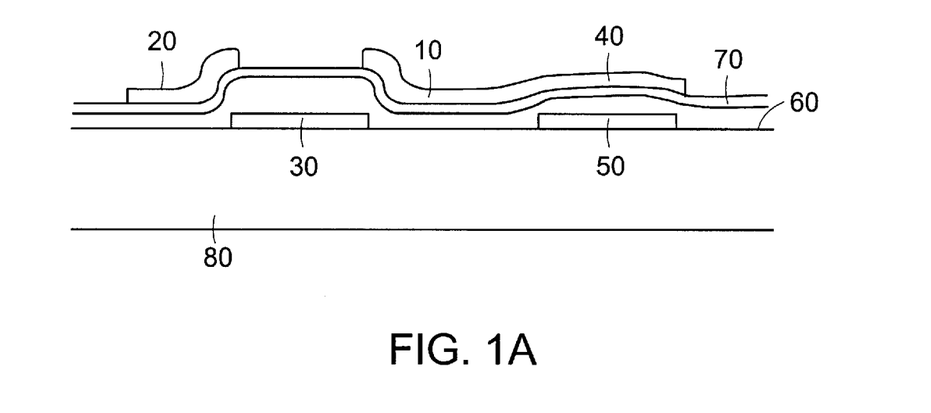
FIG. 1A shows an exemplary embodiment of the invention having a bottom-gated structure.
Figure 1B:
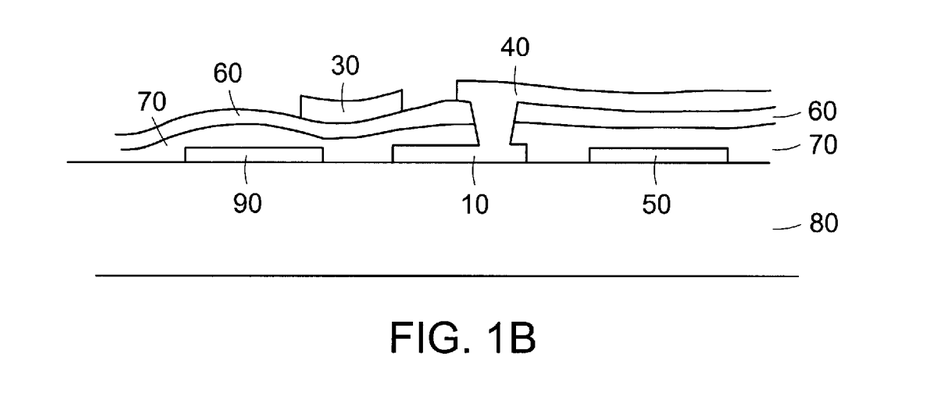
FIG. 1B shows an exemplary embodiment of the invention having a top-gated structure.

For discussion purposes, a representative minimally patterned active matrix transistor discussed in concurrently filed, co-owned, co-pending United States patent application, Attorney Docket No. INK-086, and PCT patent application, Attorney Docket No. INK-086PC, both titled "Use of a Storage Capacitor to Enhance the Performance of an Active Matrix Driven Electronic Display," appears in cross section in FIGS. 1A and 1B. The conductive gate structures 30 are covered with a thin dielectric film 60, which is covered by a semiconductor layer 70. Conductive source 10 and drain 20 features are deposited onto the semiconducting material. The top-gated structure on FIG. 1B requires dielectric and semiconductor patterning, or a suitable via technology to connect the electrode to the drain structure. By incorporating more patterning steps, one may increase the aperture by "burying" the transistors under the pixel electrode 40 as suggested in FIGS. 2A and 2B.

Referring to FIGS. 1A and 1B, the source 10, drain 20, and gate 30 structures are indicated. The diagram of FIG. 1A shows a bottom-gated structure; the diagram of FIG. 1B shows a top-gated structure. 50 denotes a storage capacitor. The source and drain labels may be reversed without loss in generality, noting that either an n-channel or a p-channel device might be used as a pass transistor.

FIGS. 2A and 2B show buried transistor architectures that offer several advantages at the expense of an increased number of process steps. The advantages include: 1) increased aperture ratio of the device (the ratio of the switched area to the total display area increases); and 2) encapsulation of the semiconductor film to prevent exposure to moisture, light, gases, or the chemistry of the display material.

Figure 3:
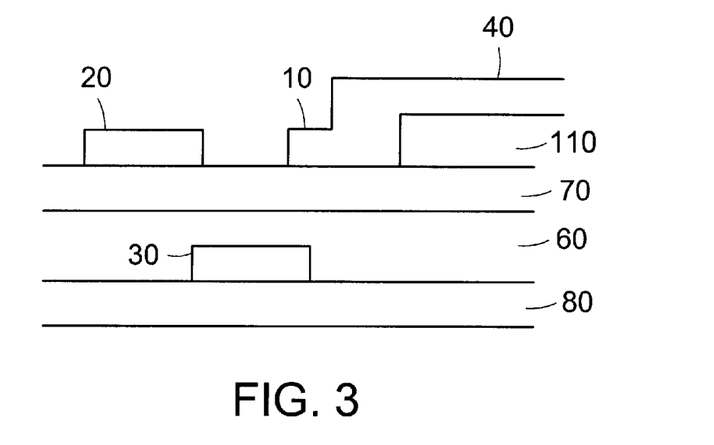
FIG. 3 shows another exemplary embodiment of the invention having a buried transistor architecture comprising a bottom gate thin film transistor.

There are alternative designs that can be used to build devices with similar functions, one of which appears in FIG. 3. FIG. 3 shows a bottom gate structure in which the pixel electrode is electrically isolated, over a part of its area, by an insulating layer. After deposition of the semiconductor layer, the insulator is deposited in a patterned fashion, followed by deposition of the source and drain electrodes. As before, the label for source and drain electrodes can be reversed without loss of generality.

Figure 4:
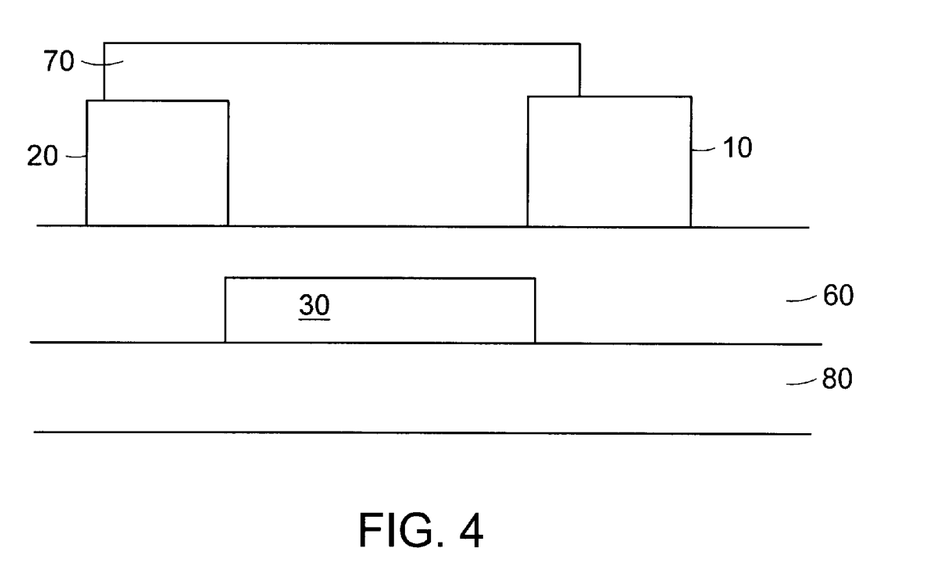
FIG. 4 shows still another exemplary embodiment of the invention having a alternative transistor architecture comprising a bottom gate thin film transistor.

FIG. 4 shows yet another alternative design, in which the gate 30 is first deposited on a substrate 80. A dielectric layer 60 is deposited over the gate 30 and the substrate 80. A source 10 and a drain 20 electrode are deposited on the dielectric layer 60, with a space between the source 10 and the drain 20 in registry with the gate 30. A semiconductor 70 is then deposited so as to extend between the source 10 and the drain 20 in a region over the dielectric layer 60, so that the gate 30 can cause the semiconductor layer 70 to become either more conductive in the case of an enhancement mode device or more resistive in the case of a depletion mode device in response to a signal applied to the gate 30. As before, the label for source and drain electrodes can be reversed without loss of generality.

Discussion of Printing Technologies

Screen or stencil printing processes are low-cost, high-volume processes that are best suited for printing features (i.e. lines and spaces) no smaller than about 150 to 200 $\mu$min a conventional production environment. In the present invention, screen and stencil printing are especially useful for printing patterned gate, source, and drain conductors in a component array. The screen printable "ink" may be selected from any of the commercially available conductive inks, or may be another material that provides suitable conductivity for the application at hand (e.g. modified versions of the commercially available inks, intrinsically conductive polymers, nanophase dispersions of conductive particles, etc.). Screen or stencil printing may also be used to lay down an encapsulation layer to protect, insulate, or otherwise contain the fabricated device. The screen printable "ink" in this case may be selected from any of the commercially available dielectric inks, either thermally or UV cured.

Fine line screen printed structures (50–75 $\mu$m lines and spaces) are achievable using high performance screens and inks, but such lines are typically too resistive and too low resolution for many commercially available electronic displays. For advanced low power displays (e.g., electrophoretics, rotating ball, rotating needle, or some liquid crystal displays) the resistive voltage drops across the conductor lines may be much smaller due to the reduced current draw of the display.

In a similar manner, a screen or stencil may be used to lay down wet films of dielectric or semiconductor material on a substrate in a patterned or unpatterned manner. To produce very thin films using this technique it is necessary to dilute the material in a solvent, which is then removed during subsequent drying or curing processes.

Ink Jet Printing

While ink jet printing offers slightly reduced throughput compared to screen and stencil printing, it is a useful technique for precisely depositing small volumes of materials to form electronic components or component arrays. The method offers line or space resolution down to about 50 $\mu$m, at best, and demands the use of low viscosity fluids (i.e., fluids having viscosities below approximately 100 cP). Ink jet technology is therefore well suited for dispensing materials such as intrinsically conductive polymers or dispersions of conductor particles (either nanoscopic or microscopic), whose viscosity is generally in the desired range. To prevent clogging while ink jetting dispersions, the largest particle size should be smaller than one-fourth of the diameter of the ink jet orifice, but preferably is smaller than one-tenth of the diameter of the ink jet orifice.

Since ink jets are well suited for precision dispensing of low viscosity fluids, they are also well suited to dispense semiconductor and dielectric materials, some of which are readily dissolved in select solvents. During this operation, ambient conditions must be controlled to ensure that the desired fraction of solvent evaporates from the drop during flight. For some air-sensitive organic semiconductors whose performance is related to solvent drying kinetics, it is desirable to perform the ink jetting operation in an inert atmosphere (e.g., nitrogen or argon) or in a solvent-laden atmosphere. Deposition conditions for such materials are described in a co-owned, pending provisional patent application U.S. Ser. No. 60/151,547, filed Aug. 31, 1999, titled "A Solvent Annealing Process for Forming a Thin Semiconductor Film with Advantageous Properties." Whenever ink jet dispensing is employed, the ink jet orifice must be positioned close enough to the substrate to ensure accurate ballistic impact of the drops with the substrate.

To achieve very well defined edges on ink jet deposited lines, we require that: 1) the substrate surface be treated to ensure surface homogeneity, and that the equilibrium contact angle of the deposited fluid on the substrate is not larger than 90°, but is preferably less than approximately 60°, and 2) the speed of the traverse of the ink jet head should be adjusted such that the drops print a continuous line (i.e., the traverse speed U<2RF, where R is a drop radius and F is a drop ejection frequency). The constraint on the equilibrium contact angle helps to ensure that thin lines of liquid deposited on the surface do not break up into individual drops due to capillary instabilities or disjoining pressures.

In another aspect, the invention features a process by which the drops are frozen to the substrate upon impact. Independent control of the substrate temperature gives the operator a higher degree of control over the spreading of the drop on the substrate For many solvent-based materials and polymers, for example, the viscosity is known to be a function of the temperature. By depositing such liquids on a cold substrate, the viscosity of the deposited liquid may be increased substantially above the value as measured upon ejection from the orifice. Depositing on a cold substrate therefore helps to stabilize the liquid on the substrate, thereby enabling fine lines to be successfully patterned. Also, for materials that undergo a distinct phase change, it is possible to completely solidify the jetted liquid upon impact with the cold substrate (see, for example, Duthaler, G. 1999, "Molten Drop Deposition and the Dynamics of the Molten Contact Line," MIT PhD Thesis; or Duthaler, G. 1995, "Design of a Drop-on-Demand Delivery System for Molten Solder Microdrops", MIT MSME Thesis).

Offset, Flexographic, Intaglio, and Gravure Printing

Offset, flexographic, intaglio, and gravure printing techniques may be used to perform all-additive printing processes useful in the construction of an electronic component or electronic component array. Currently, these techniques and the inks printed using these techniques are used for graphic arts and other more traditional printing applications. In the embodiments contemplated, one or more of these techniques may be used to deposit in an all-additive manner a functional electronic material.

Offset lithography is a method by which chemical differences are maintained on a printing plate such that ink wets one region and not another. The patterned ink is transferred from the plate to a rubberized "blanket" surface, after which it is transferred to the desired substrate. The offset printing process offers very high throughput, good resolution, and is optimized for low viscosity materials (i.e., those inks having viscosities less than approximately 100 cP).

Flexographic printing is a printing process in which the printing areas are raised above non-printing areas on a printing plate (made of either rigid metal, photopolymer, or elastomer). Ink is transferred from rollers onto the raised regions, and is then printed onto the substrate. Microcontact printing, a type of soft lithography, is a type of flexographic printing in which a monolayer of material is transferred onto a surface using an elastomeric printing plate.

Intaglio printing is a printing process in which the printing areas are sunken with respect to the non-printing areas on the printing plate (most often made from rigid metal). The printing areas are filled with the ink, which is subsequently transferred to the substrate. Gravure printing is a type of intaglio printing process, in which precisely arranged, small dimples formed in the printing plate carry ink until it is transferred directly to a substrate. Some production printing presses are hybrid machines; for instance, they use gravure rollers to feed ink to a flexographic elastomer printing plate.

These printing techniques require inks with low viscosity (i.e., those inks having viscosities less than approximately 100 cP), so low viscosity intrinsically conductive polymers or dispersions of conductor particles (either nanoscopic or microscopic) are printable. These inks are preferably organic solvent based (e.g., alpha-terpinol or trioctylphosphine for nanoparticle based inks; m-cresol, N-methylpyrrolidone, or dimethylformamide for conductive polymers).

Solutions of soluble dielectric and semiconductor materials may also be printed using these techniques. Printable dielectric materials include but are not limited to benzocyclobutene (Dow Chemical), polyimids, polyvinylphenol, spin-on-glass, FLARE™, and SiLK™. FLARE™ is an organic spin-on polymer dielectric formulated for use in both subtractive aluminum and copper damascene applications that is made by Honeywell Corporation's Advanced Microelectronic Materials operation. SiLK™ is a wet processable polymer dielectric made by Dow Chemical Company. Both FLARE™ and SiLK™ are low dielectric constant (i.e., low k) materials that have been formulated for use as dielectric layers in conventional CMOS processing. However, both can be straightforwardly printed using the methods described herein.

Soft Lithography

In one embodiment, soft lithography techniques are used to directly deposit material onto the substrate to form the electronic components or component array. Soft lithography encompasses a set of technologies, including but not limited to microcontact printing and micromolding. Microcontact printing is actually a form of flexographic printing, in which a patterned elastomeric stamp (e.g., a printing plate) is used to pattern a molecularly thin film on a surface. The stamp is formed by casting the elastomer against a rigid master manufactured using conventional photolithographic techniques.

Microcontact printing has garnered much attention because of its widespread use by the research community as a subtractive patterning technology. Specifically, the printing technique has been extensively used to deposit self-assembled monolayers of alkanethiol onto metal surfaces (e.g., gold and silver, preferably). The monolayer acts as an etch resist, and the underlying metal may be chemically etched to produce very high resolution features. Lines and spaces down to tens of nanometers have been demonstrated. See, for example, Younan Xia and George Whitesides, "Soft Lithography," *Angew. Chem. Int. Ed.* 1998, 37, 550–575).

Microcontact printing has been used in a multi-step, all-additive manner as well. Researchers inked an elastomeric stamp with a palladium colloid, which was printed onto a substrate to form patterned features. The patterned features were rendered functional (i.e., electrically conductive) by electroless deposition of copper on the patterned palladium colloid.

In the present embodiment, we use a photolithographically defined master as a mold to form a printing plate, which can be either elastomeric or rigid metal. Elastomeric plates may be made by casting. Metal plates may be made by electroforming. The same method is used to make nickel tools used as master stamps in the compact disk manufacturing process. We use the printing plate to deposit in a single step a functional material such as an intrinsically conductive polymer or a dispersion of conductor particles (either nanoscopic or microscopic).

The desired film thickness depends upon the application, but is generally not molecularly thin. For conductive line applications, printed films should be sufficiently sized to give acceptable line resistance for the electronic display application at hand. For typical active matrix display applications, film thicknesses might be of the order of 0.1 µm to 5 µm, depending upon the line resolution and the resistivity of the conductor. For printed dielectric films, thickness should be chosen to optimize device performance. For typical thin film transistor applications, film thickness between 0.1 µm and 2.0 µm are common. Wet printed semiconductors must be thick enough to allow for proper device functioning (at least 5 to 10 molecules thick), but are preferably thicker (usually 100 to 500 nm) to ensure acceptable uniformity across the display.

Another soft lithography process is known as micromolding, which refers to a set of processes encompassing microtransfer molding, micromolding in capillaries, and solvent assisted micromolding. These processes are methods by which an ink is forced into a patterned mold using mechanical, capillary, or chemical forces. The ink is then cured and transferred from the mold to the substrate. These methods may also be used to produce the features of the electronic components or component arrays.

Materials Amenable for Printing

There are known materials in the art that, once printed, can form either conductors, semiconductors, or insulating layers. Several examples include:

Suspensions of colloidal conductive particles in a polymer base are well known as conductive inks. Carbon, graphite, aluminum, chrome, gold, silver, nickel, metal oxides such as indium tin oxide can be dispersed and deposited to form conductive elements. Soluble materials, such as polyaniline and certain polythiophenes can also form conductive films.

Certain organic semiconductors can be deposited by printing. Examples include poly(3-alkyl)thiophene, hexathiophene and other oligothiophenes, α,ω-dihexyl quaterthiophene and other alkyl substituted oligithiophenes, and other soluble organic semiconductors. Colloidal suspensions of inorganic semiconductive particles, such as silicon, cadmium selenide, gallium arsenide, and other semiconductors also can be used as the semiconductive materials.

A wide variety of soluble polymers, glasses, inorganic films, and composite materials are useful as insulating and dielectric materials. These materials can be either soluble in a solvent, or suspended as a colloid. Several examples include benzocyclobutene (Dow Chemical), polyimids, polyvinylphenol, or spin-on-glass materials.

Vacuum Based Processes

While we anticipate that solvent-based printing methods will be an economical means of constructing electronic arrays for addressing electronic displays, there are materials that can be useful in such an electronic array that cannot be made soluble enough in practical solvents to be printed using the methods described herein. For example, semiconducting organic materials such as pentacene and thiophene oligomers are insoluble in common solvents, and thus not readily printed. Additionally, inorganic semiconducting materials, most notably silicon (amorphous, microcrystalline, polycrystalline, or single crystal) and inorganic dielectric materials (e.g., silicon nitride, silicon dioxide, and the like) generally are not amenable to printing but some forms of which can be evaporated onto a substrate or formed in a reactive gas environment. Metal conducting lines, useful in forming these devices, can also be deposited using vacuum processes.

Additionally, there are cases in which material deposited during one printing step might be attacked by the solvent from a subsequent printing step. In such a case, the integrity of the electronic device structure will be compromised. Gas-phase processing can be advantageous in such a case, in order to add materials without damaging underlying materials.

For these reasons, it can be advantageous to use a vacuum-based processing step to deposit one or more layers of materials in forming the electronic device. Examples of vacuum-based processes include evaporation, sputtering, and chemical vapor deposition.

One type of vacuum process uses blanket deposition of the desired material, followed by the use of resists and etching to form patterns. Alternatively, for coarse resolution structures it is possible to deposit the desired material through a contact or proximity mask. The mask intercepts the material as it travels from the material source to the target, only allowing deposition in areas where there is a hole through the mask. In this way, component materials can be deposited in patterns using all-additive processing.

Hybrid Designs and Surface Treatment

The above methods are used to deposit the constituent materials of electronic components onto a substrate. Any combination of these methods may also be used to create such structures. An illustrative example, such as that depicted in FIG. 4, includes the following deposition steps: 1) a gate structure 30 deposited on a substrate 80 using flexo-gravure printing, 2) a layer of dielectric material 60 deposited using slot coating, 3) high resolution features of the source 10 and drain 20 structures deposited using soft lithography techniques, 4) coarse features of the source 10 and drain 20 structures deposited in a patterned structure using screen printing, and 5) patterned semiconductor material 70 deposited using ink jet printing.

Alternatively, some components can be deposited using subtractive methods, with all-additive techniques used for other portions of the device. For example, in a bottom gate structure the gate electrodes 30 can be formed through deposition of a metal film followed by etching, with the remaining components deposited using printing. As another example, the gate electrode 30 can be photolithographically defined, a dielectric polymer 60 wet-coated, a reactive chemical vapor deposition process used to deposit a silicon semiconducting layer 70, and the source 10 and drain 20 printed using soft lithography techniques. As another example, a top gate thin film transistor structure may be constructed by photolithographically defining the source 10 and drain 20 structures, vacuum depositing an inorganic semiconductor 70 and dielectric 60, and offset, flexo-gravure, or screen printing the gate structure 30. Many permutations are possible, as will be recognized by those of ordinary skill in the printing arts given these examples. We emphasize that the optimal design draws upon the strengths of each of the printing technologies to produce the lowest cost, highest quality electronic devices.

We also note that the quality of the printed layers depends upon the surface chemistry of the substrate. At this time, we identify that substrate surface roughness plays an important role in determining the quality of the print, smoother materials providing higher quality. In another aspect, the invention features chemical treatment of the substrate and previously deposited layers with agents to either promote or discourage wetting of the subsequent print layer on said substrate or deposited layer. Finally, we note that the electrical properties of the printed materials are highly dependent upon the material processing conditions, and are particularly sensitive to curing and /or drying conditions. Final device performance therefore can depend intimately upon all process steps involved in printing the components of an electronic device.

Addressable Displays

The addressing device fabricated in accordance with the above-described methods can be used to address various electronic displays including an electrophoretic display. Electrophoretic displays have been the subject of intense research and development for a number of years. Electrophoretic displays have attributes of good brightness and contrast, wide viewing angles, state bistability, and low power consumption when compared with liquid crystal displays. Nevertheless, problems with the long-term image quality of these displays have prevented their widespread usage. For example, particles that make up such displays tend to cluster and settle, resulting in inadequate service-life for these displays.

An encapsulated, electrophoretic display typically does not suffer from the clustering and settling failure mode of traditional electrophoretic devices and provides further advantages, such as the ability to print or coat the display on a wide variety of flexible and rigid substrates. Use of the word "printing" is intended to include all forms of printing and coating, including, but without limitation: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. Thus, the resulting display can be flexible. Further, because the display media can be printed (using a variety of methods), the display itself can be made inexpensively.

In broad overview, the invention relates to encapsulated electrophoretic displays that provide a flexible, reflective display that can be manufactured easily and consume little power (or no power in the case of bistable displays in certain states), as well as materials and methods useful in their construction. Such displays, therefore, can be incorporated into a variety of applications. The display can be formed from and can include particles that move in response to an electric charge. This mode of operation is typical in the field of electrophoretics. A display in which the particles, ordered by an electric charge, take on a certain configuration can take on many forms. Once the electric field is removed, the particles can be generally stable (e.g., bistable). Additionally, providing a subsequent electric charge can alter a prior configuration of particles. Some encapsulated electrophoretic displays may include two or more different types of particles. Such displays may include, for example, displays containing a plurality of anisotropic particles and a plurality of second particles in a suspending fluid. Application of a first electric field may cause the anisotropic particles to assume a specific orientation and present an optical property. Application of a second electric field may then cause the plurality of second particles to translate, thereby disorienting the anisotropic particles and disturbing the optical property. Alternatively, the orientation of the anisotropic particles may allow easier translation of the plurality of second particles. The particles may have a refractive index that substantially matches the refractive index of the suspending fluid.

An encapsulated electrophoretic display can be constructed so that the optical state of the display is stable for some length of time. When the display has two states that are stable in this manner, the display is bistable. If more than two states of the display are stable, then the display is multistable. For the purpose of the present invention, the term bistable indicates a display in which any optical state remains fixed once the addressing voltage is removed. However, the definition of a bistable state depends upon the display's application. A slowly decaying optical state can be effectively bistable if the optical state is substantially unchanged over the required viewing time. For example, in a display that is updated every few minutes, a display image that is stable for hours or days is effectively bistable for a particular application. Thus, for purposes of the present invention, the term bistable also indicates a display with an optical state sufficiently longlived so as to be effectively bistable for a particular application. Alternatively, it is possible to construct encapsulated electrophoretic displays in which the image decays quickly once the addressing voltage to the display is removed (i.e., the display is not bistable or multistable). Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may include capsules dispersed in a binder. The capsules may be of any size or shape. The capsules may, for example, be spherical and may have diameters in the millimeter range or the micron range, but are preferably from about ten to about a few hundred microns. The capsules may be formed by an encapsulation technique. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further include a suspending fluid in which the particles are dispersed.

Generally, an encapsulated electrophoretic display includes a capsule with one or more species of particle that either absorb or scatter light and that are suspended in a fluid. One example is a system in which the capsules contain one or more species of electrophoretically mobile particles dispersed in a dyed suspending fluid. Another example is a system in which the capsules contain two separate species of particles suspended in a clear suspending fluid, in which one species of particle absorbs light (black), while the other species of particle scatters light (white). There are other extensions (more than two species of particles, with or without a dye, etc.). The particles are commonly solid pigments, dyed particles, or pigment/polymer composites.

In electrophoretic displays, the particles may be oriented or translated by placing an electric field across the capsule. The electric field may include an alternating-current field or a direct-current field. The electric field may be provided by at least one pair of electrodes disposed adjacent to a display comprising the capsule.

The successful construction of an encapsulated electrophoretic display requires the proper interaction of all these materials and processes. Materials such as a polymeric binder (for example, for binding the capsules to a substrate), electrophoretic particles, fluid (for example, to surround the electrophoretic particles and provide a medium for migration), and a capsule membrane (for example, for enclosing the electrophoretic particles and fluid) must all be chemically compatible. The capsule membranes may engage in useful surface interactions with the electrophoretic particles, or may act as an inert physical boundary between the fluid and the binder. Polymer binders may set as adhesives between capsule membranes and electrode surfaces.

Materials for use in creating electrophoretic displays relate to the types of materials, including, but not limited to, particles, dyes, suspending fluids, and binders used in fabricating the displays. In one embodiment, types of particles that may be used to fabricate suspended particle displays include scattering pigments, absorbing pigments and luminescent particles. Such particles may also be transparent. Exemplary particles include titania, which may be coated in one or two layers with a metal oxide, such as aluminum oxide or silicon oxide, for example. Such particles may be constructed as corner cubes. Luminescent particles may include, for example, zinc sulfide particles. The zinc sulfide particles may also be encapsulated with an insulative coating to reduce electrical conduction. Light-blocking or absorbing particles may include, for example, dyes or pigments. Types of dyes for use in electrophoretic displays are commonly known in the art. Useful dyes are typically soluble in the suspending fluid, and may further be part of a polymeric chain. Dyes may be polymerized by thermal, photochemical, and chemical diffusion processes. Single dyes or mixtures of dyes may also be used.

A suspending (i.e., electrophoretic) fluid may be a high resistivity fluid. The suspending fluid may be a single fluid, or it may be a mixture of two or more fluids. The suspending fluid, whether a single fluid or a mixture of fluids, may have its density substantially matched to that of the particles within the capsule. The suspending fluid may be halogenated hydrocarbon, such as tetrachloroethylene, for example. The halogenated hydrocarbon may also be a low molecular weight polymer. One such low molecular weight polymer is poly(chlorotrifluoroethylene). The degree of polymerization for this polymer may be from about 2 to about 10.

Furthermore, capsules may be formed in, or later dispersed in, a binder. Materials for use as binders include water-soluble polymers, water-dispersed polymers, oil-soluble polymers, thermoset polymers, thermoplastic polymers, and uv- or radiation-cured polymers.

In some cases, a separate encapsulation step of the process is not necessary. The electrophoretic fluid may be directly dispersed or emulsified into the binder (or a precursor to the binder material) to form what may be called a "polymer-dispersed electrophoretic display." In such displays, the individual electrophoretic phases may be referred to as capsules or microcapsules even though no capsule membrane is present. Such polymer-dispersed electrophoretic displays are considered to be subsets of encapsulated electrophoretic displays.

In an encapsulated electrophoretic display, the binder material surrounds the capsules and separates the two bounding electrodes. This binder material must be compatible with the capsule and bounding electrodes and must possess properties that allow for facile printing or coating. It may also possess barrier properties for water, oxygen, ultraviolet light, the electrophoretic fluid, or other materials. Further, it may contain surfactants and cross-linking agents, which could aid in coating or durability. The polymer-dispersed electrophoretic display may be of the emulsion or phase separation type.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of manufacturing an electronic device comprising:

a) providing a substrate;

b) depositing a gate structure on the substrate using flexo-gravure printing;

c) depositing a layer of dielectric material using slot coating, the layer of dielectric material covering the gate structure and a portion of the substrate;

d) depositing adjacent the dielectric layer on a side thereof opposite the gate structure using screen printing a low resolution feature of a source structure and a low resolution feature of a drain structure, the source structure and the drain structure being deposited in a patterned structure having a space therebetween;

e) depositing a semiconductor material adjacent the dielectric layer in the space between the source structure and the drain structure using ink jet printing a semiconductor material; and f) disposing at least one electronic element adjacent said addressing device, such that said addressing device addresses said at least one electronic element to control a behavior of said electronic element.

2. The method of claim 1, further comprising after step (c) and before step (d):

depositing adjacent the dielectric layer on a side thereof opposite the gate structure a high resolution feature of a source structure and a high resolution feature of a drain structure using soft lithography techniques, the source structure and the drain structure having a space therebetween.

3. The method of claim 1 wherein screen printing involves using a conductive paste.

4. The method of claim 3 wherein the conductive paste has a viscosity between about 1000 cP and about 50000 cP.

5. The method of claim 1 wherein ink jet printing includes ink jet printing at least one circuit element using an ink having a viscosity of less than about 100 cP.

6. The method of claim 1 wherein ink jet printing includes ink jet printing at least one circuit element using a plurality of particles that are smaller than ¼ of a diameter of an orifice of an ink jet head.

7. The method of claim 1 wherein ink jet printing includes ink jet printing at least one circuit element using a plurality of particles that are smaller than 1/10 of a diameter of an orifice of an ink jet head.

8. The method of claim 1 wherein ink jet printing includes ink jet printing at least one circuit element using an ink comprising a semiconductor dissolved in a solvent.

9. The method of claim 1 wherein ink jet printing includes ink jet printing at least one circuit element using an ink comprising a dielectric material dissolved in a solvent.

10. The method of claim 1 wherein ink jet printing includes ink jet printing at least one circuit element by moving an ink jet head relative to the substrate at a speed U, wherein U is less than the quantity 2RF, where R is a drop radius and F is a drop ejection frequency.

11. The method of claim 1 wherein ink jet printing includes freezing an ink jet drop upon the substrate upon impact.

12. The method of claim 1 wherein an ink jet drop is frozen by independent control of the substrate temperature.

13. The method of claim 2 wherein printing by use of soft lithography includes printing at least one circuit element by microcontact printing using one of an elastomeric stamp and a rigid stamp.

14. The method of claim 2 wherein printing by use of soft lithography includes printing through one of a contact mask and a proximity mask.

15. The method of claim 2 wherein printing by use of soft lithography includes printing at least one circuit element using one of evaporation, sputtering and chemical vapor deposition.

16. The method of claim 2 wherein printing by use of soft lithography includes printing at least one circuit element by transferring an ink from a mold to the substrate and curing the ink.

* * * * *

UNITED STATES PATENT AND TRADEMARK OFFICE
CERTIFICATE OF CORRECTION

PATENT NO.   : 6,521,489 B2
DATED        : February 18, 2003
INVENTOR(S)  : Duthaler et al.

It is certified that error appears in the above-identified patent and that said Letters Patent is hereby corrected as shown below:

<u>Column 18,</u>
Line 5, please delete "said" and insert in its place -- an --;
Line 6, please insert -- formed by step (e) -- after the first occurrence of the word "device".

Signed and Sealed this

Twenty-third Day of September, 2003

JAMES E. ROGAN
*Director of the United States Patent and Trademark Office*